(12) United States Patent
Guo et al.

(10) Patent No.: US 8,309,418 B2
(45) Date of Patent: Nov. 13, 2012

(54) FIELD EFFECT TRANSISTOR DEVICE WITH SHAPED CONDUCTION CHANNEL

(75) Inventors: Dechao Guo, Wappingers Falls, NY (US); Shu-Jen Han, Cortlandt Manor, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/860,977

(22) Filed: Aug. 23, 2010

(65) Prior Publication Data
US 2012/0043585 A1    Feb. 23, 2012

(51) Int. Cl.
*H01L 21/336* (2006.01)
(52) U.S. Cl. ........ 438/270; 438/282; 438/300; 438/303; 257/192; 257/330; 257/E21.619; 257/E29.26
(58) Field of Classification Search ............... 438/282
See application file for complete search history.

(56) References Cited

U.S. PATENT DOCUMENTS

| | | | | |
|---|---|---|---|---|
| 6,171,916 | B1 * | 1/2001 | Sugawara et al. | 438/303 |
| 6,358,800 | B1 * | 3/2002 | Tseng | 438/268 |
| 2003/0068864 | A1 * | 4/2003 | Il-Yong et al. | 438/270 |
| 2004/0132256 | A1 * | 7/2004 | Kim et al. | 438/296 |
| 2005/0090066 | A1 * | 4/2005 | Zhu et al. | 438/300 |
| 2007/0184614 | A1 * | 8/2007 | Adkisson et al. | 438/259 |
| 2008/0203428 | A1 * | 8/2008 | Choi | 257/190 |
| 2009/0114949 | A1 * | 5/2009 | Hebert | 257/190 |

* cited by examiner

*Primary Examiner* — Matthew W Such
*Assistant Examiner* — Abul Kalam
(74) *Attorney, Agent, or Firm* — Cantor Colburn LLP; Vazken Alexanian

(57) ABSTRACT

A field effect transistor device includes a substrate, a silicon germanium (SiGe) layer disposed on the substrate, gate dielectric layer lining a surface of a cavity defined by the substrate and the silicon germanium layer, a metallic gate material on the gate dielectric layer, the metallic gate material filling the cavity, a source region, and a drain region.

8 Claims, 4 Drawing Sheets

FIELD EFFECT TRANSISTOR DEVICE WITH SHAPED CONDUCTION CHANNEL

FIELD OF INVENTION

The present invention relates to semiconductor field effect transistors.

DESCRIPTION OF RELATED ART

Planar field effect transistor (FET) devices include a gate stack disposed on a channel region of a substrate and source and drain regions disposed adjacent to the gate. The gate stack includes a gate dielectric layer or inversion layer having a thickness (Tinv). In a planar FET, the gate has a length that may be defined as a distance between the source and drain regions, i.e., the conductive length of the channel region.

A number of planar FETs may be grouped on a substrate; the distance between the gates of the FETs or pitch, becomes smaller as the scale of the FETs are reduced. The reduction in pitch affects the gate length and electrostatic properties of the devices.

BRIEF SUMMARY

In one aspect of the present invention, a field effect transistor device includes a substrate, a silicon germanium (SiGe) layer disposed on the substrate, gate dielectric layer lining a surface of a cavity defined by the substrate and the silicon germanium layer, a metallic gate material on the gate dielectric layer, the metallic gate material filling the cavity, a source region, and a drain region.

In another aspect of the present invention, method for forming a field effect transistor device includes forming a silicon germanium (SiGe) layer on a substrate, forming a layer of spacer material on the SiGe layer, removing portions of the spacer material and the SiGe layer to form a cavity, the cavity exposing a portion of the substrate, forming a gate dielectric liner layer on exposed surfaces of the cavity and the layer of spacer material, forming a metallic gate layer on the gate dielectric liner layer, removing portions of the gate dielectric liner layer and the metallic gate layer to expose the layer of spacer material, patterning and removing portions of the layer of spacer material to form a spacer and expose portions of the SiGe layer, and forming a source region and a drain region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-9 illustrate an exemplary method for fabricating the device of FIG. 1, in which:

FIG. 2 illustrates a graded layer formed on a substrate;

FIG. 3 illustrates the formation of a cavity;

FIG. 4 illustrates the formation of a gate dielectric layer;

FIG. 5 illustrates the removal of portions of the gate dielectric layer and a metallic gate material;

FIG. 6 illustrates the formation of spacers;

FIG. 7 illustrates the formation of doped regions;

FIG. 8 illustrates an implantation of ions; and

FIG. 9 illustrates the formation of a layer.

DETAILED DESCRIPTION

Figure 1:
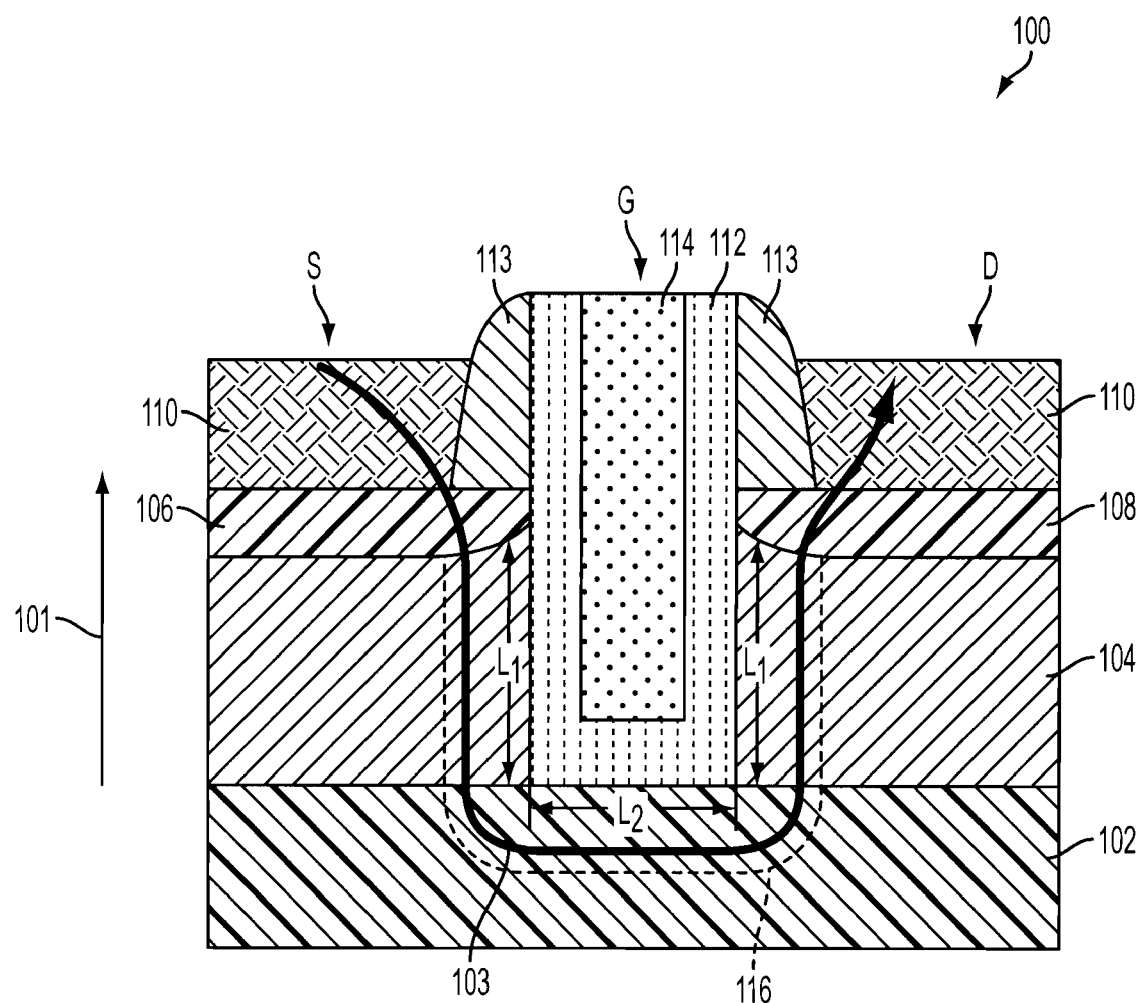
FIG. 1 illustrates a side cut-away view of an exemplary embodiment of a field effect transistor (FET) device.

FIG. 1 illustrates a side cut-away view of an exemplary embodiment of a field effect transistor (FET) device 100. The device 100 includes a layer 104 that may include graded silicon germanium (SiGe), uniform SiGe, Si, or another semiconductor material disposed on a substrate 102. The substrate 102 may include, for example, a layer of silicon, SiGe, or a silicon on insulator (SOI) layer. The graded SiGe layer has a graduated density of the proportion of Ge to Si such that the proportion of Ge to Si is lower in the region of the layer 104 adjacent to the substrate 102 and the proportion gradually increases in the direction of the arrow 101. The graded SiGe is formed by an epitaxial growth process. The ratio of Ge to Si ranges from 5% of Ge to Si at the bottom of layer 104 to higher percentage at the top of layer 104 (where the top of the layer 104 is indicated by the direction of the arrow 101). In alternate embodiments the SiGe layer may have a uniform Ge to Si ratio from the bottom of layer 104 to the top of the layer 104, with the thickness of layer 104 thinner than the critical thickness of the device 100. The layer 104 includes doped regions 106 and 108 that may be implanted with ions such as, for example p-type and/or n-type ions, that form portions of a source region (S) and a drain region (D). The source and drain regions are further defined by a layer 110 that may include for example, p-type and/or n-type doped epitaxially grown silicon material, or another type of suitable material. The substrate 102 and the layer 104, and a spacer 113 define a cavity that is lined with a gate dielectric layer 112 that may include for example, a high-k or silicon dioxide material. A metallic gate material 114 is disposed on the gate dielectric layer 112 and fills the remainder of the cavity. The metallic gate material 114 defines a gate region (G) and may include, for example, titanium nitride, tantalum nitride, or tantalum silicon nitride. The spacer 113 may include, for example, an oxide or silicon nitride material.

A channel region 116 of the device is illustrated by the dashed line in FIG. 1. The distance ($L_1$) between the doped regions 106 and 108 of the layer 104 and the substrate 102 and the distance ($L_2$) that includes the width of the metallic gate material 114 and the gate dielectric layer 112 define the length (L) of the channel region 116 of the device 100, where $L=(2*L_1+L_2)$. The line 103 illustrates the conduction path of the device 100 through the channel region 116.

Figure 2:
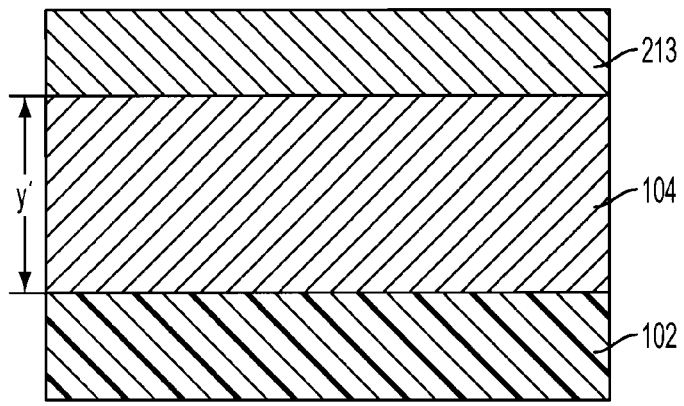

FIGS. 2-9 illustrate an exemplary method for fabricating the device 100 (of FIG. 1). Referring to FIG. 2, the graded layer 104 having a thickness (y') is formed on a substrate 102. The substrate 102 may include, for example, a silicon or silicon on insulator (SOI) material. The graded layer 104 is formed by an epitaxial growth process. A layer of spacer material 213 is formed on the layer 104. The spacer material 213 may include, for example, silicon oxide or silicon nitride material.

Figure 3:
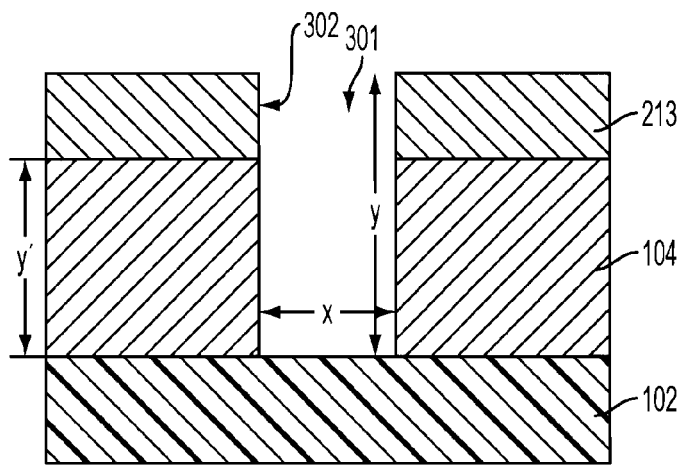

FIG. 3 illustrates the resultant structure following the formation of a cavity 301 having an exposed inner surface 302 defined by the substrate 102, the layer 104, and the spacer material 213, that exposes the substrate 102. The cavity has a depth (y) and a width (x). The cavity 301 may be formed by, for example, patterning and etching using a reactive ion etching (RIE) or other suitable etching process to form the cavity 213. The etching process may, for example, selectively etch the layer 104, or be timed such that a minimal amount of the substrate 102 material is removed.

The dimensions $L_1$ and $L_2$ that define the length of the channel region 116 of the device 100 (of FIG. 1) are partially defined by the depth y and width x of the channel 301 (of FIG. 3) respectively. The thickness (y') of the layer 104 may be increased or decreased (thereby increasing or decreasing the cavity depth y) to meet the desired channel length L of the device 100. Likewise, the channel width x may be increased or decreased to increase or decrease $L_2$. Thus, the channel length L may also be defined as being approximately equal to (2y'+x).

Figure 4:
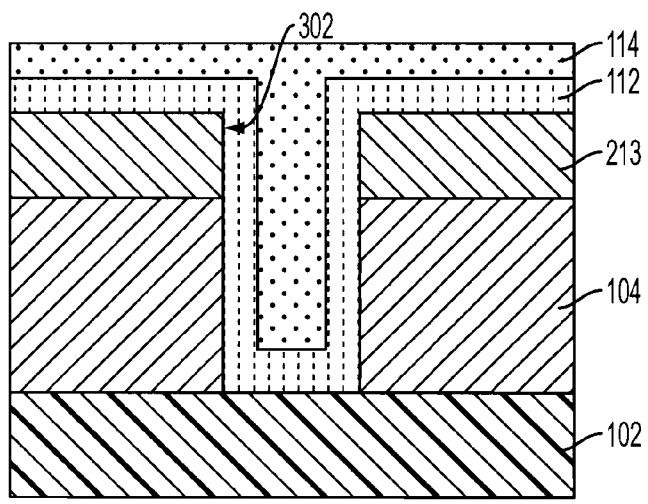

FIG. 4 illustrates the formation of a gate dielectric layer 112 that lines the surface 302 of the cavity 301 (of FIG. 3) and on the spacer material 213, and the formation of a metallic gate material 114 on the gate dielectric layer 112 that fills the remainder of the cavity 301. The gate dielectric layer 112 and metallic gate material may be formed by, for example a chemical vapor deposition (CVD) process, an atomic layer deposition (ALD), or a physical vapor deposition (PVD).

Figure 5:
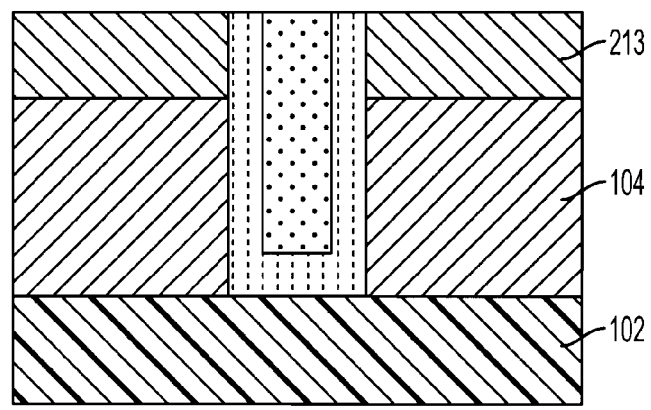

FIG. 5 illustrates the resultant structure following the removal of portions of the gate dielectric layer 112 and the metallic gate material 114 to expose the spacer material 213. The gate dielectric layer 112 and the metallic gate material 114 may be removed by, for example, a chemical mechanical polishing (CMP) or other suitable process.

Figure 6:
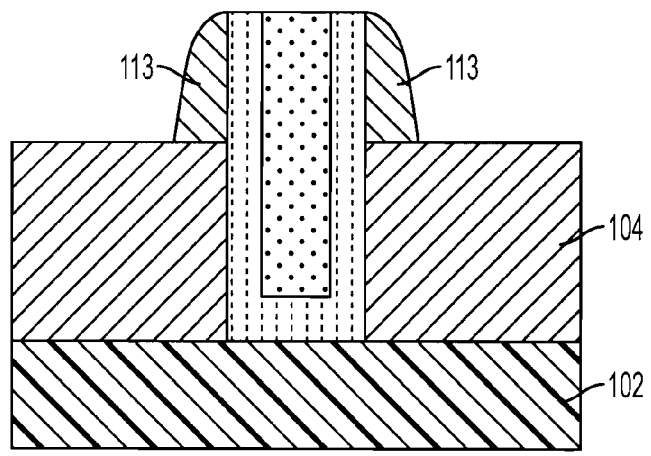

FIG. 6 illustrates the formation of spacers 113 from the spacer material 213. The spacers 113 may be formed by, for example, a patterning and etching process such as RIE that removes portions of the spacer material 213 to expose portions of the layer 104 and define the spacers 113.

Figure 7:
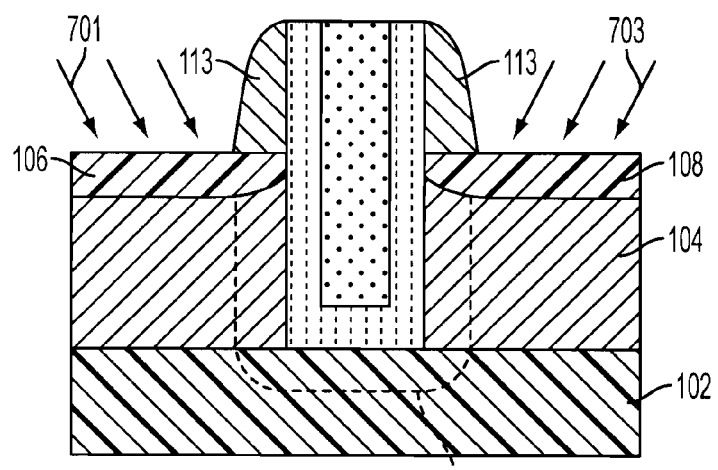

FIG. 7 illustrates the implantation of ions to form the doped regions 106 and 108 in the layer 104. The ions may include n-type and/or p-type ions that may be implanted at an angle as shown by the arrows 701 and 703. An angled implantation method allows the doped regions 106 and 108 to extend under the spacer 113.

Figure 8:
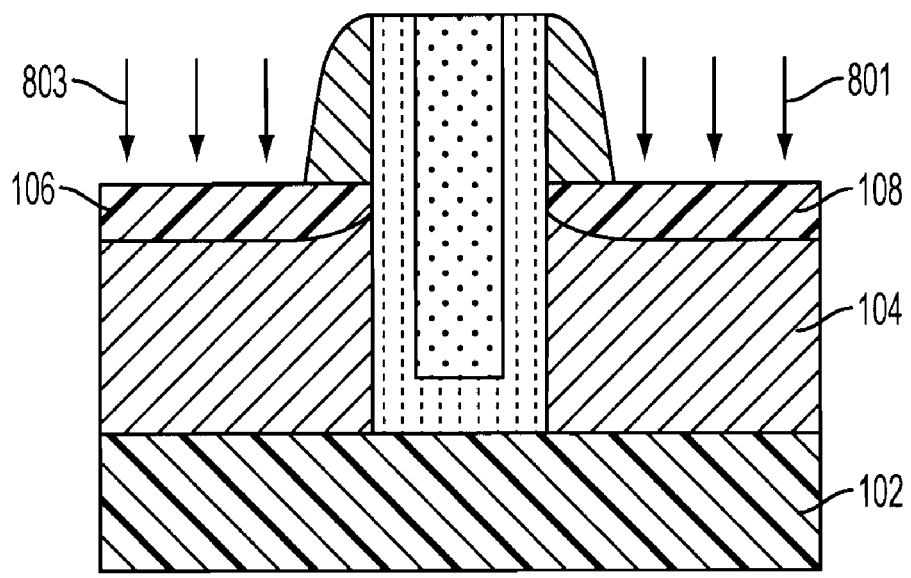

FIG. 8 illustrates an optional implantation of ions in the doped regions 106 and 108 that may be implanted, for example, along the vertical lines 803 and 801 to further imbed n-type and/or p-type ions in the doped regions 106 and 108.

Figure 9:
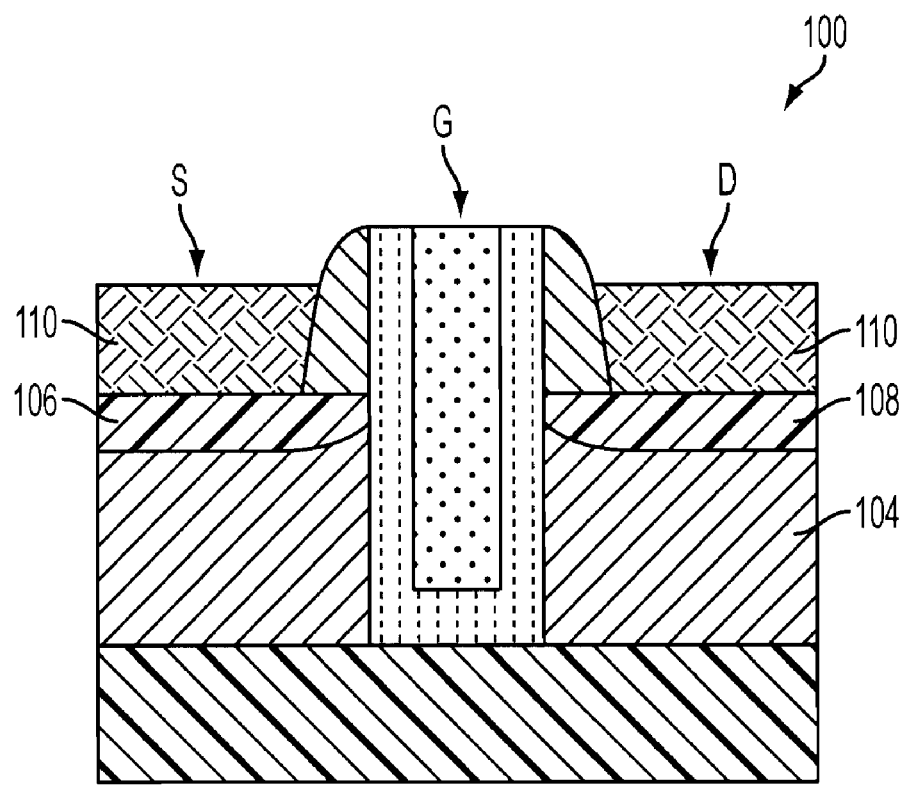

FIG. 9 illustrates the formation of a layer 110 to form the device 100. The layer 110 may include, for example, epitaxially grown silicon material or silicon material formed from another process. The layer 110 may be doped with ions in-situ (i.e., during the epitaxial growth), or following the growth of the silicon material, using an ion implantation method.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a field effect transistor device, the method including:
    forming a silicon germanium (SiGe) layer on a substrate;
    forming a layer of spacer material on the SiGe layer;
    removing portions of the spacer material and the SiGe layer to form a cavity, the cavity exposing a portion of the substrate;
    forming a gate dielectric liner layer on exposed surfaces of the cavity and the layer of spacer material;
    forming a metallic gate layer on the gate dielectric liner layer;
    removing portions of the gate dielectric liner layer and the metallic gate layer to expose the layer of spacer material;
    patterning and removing portions of the layer of spacer material to form a spacer and expose portions of the SiGe layer; and
    forming a source region and a drain region in the exposed portions of the SiGe layer.

2. The method of claim 1, wherein the forming the source region and the drain region includes implanting ions in portions of the SiGe layer.

3. The method of claim 2, wherein the method further includes forming a layer of ion doped silicon material on the SiGe layer following the implantation of ions in portions of the SiGe layer.

4. The method of claim 3, wherein the ion doped silicon material includes a epitaxially grown silicon material.

5. The method of claim 1, wherein the SiGe layer is formed with a graduated proportion of germanium (Ge) to silicon (Si) such that a proportion of Ge to Si in a region of the SiGe layer adjacent to the substrate is lower than a proportion of Ge to Si in a region of the SiGe layer proximate to the source and drain regions.

6. The method of claim 1, wherein the substrate includes silicon.

7. The method of claim 1, wherein the gate dielectric liner layer partially defines a channel region in the SiGe layer and the substrate.

8. The method of claim 1, wherein the cavity includes a depth (y) and a width (x), wherein a channel region of the device has a length partially defined by (2y+x).

* * * * *